United States Patent [19]
Sweatt

[11] Patent Number: 5,920,380
[45] Date of Patent: Jul. 6, 1999

[54] APPARATUS AND METHOD FOR GENERATING PARTIALLY COHERENT ILLUMINATION FOR PHOTOLITHOGRAPHY

[75] Inventor: William C. Sweatt, Albuquerque, N.M.

[73] Assignee: Sandia Corporation, Livermore, Calif.

[21] Appl. No.: 08/994,850

[22] Filed: Dec. 19, 1997

[51] Int. Cl.$^6$ ............................. G03B 27/32; G03B 27/72
[52] U.S. Cl. ................................. 355/77; 355/71
[58] Field of Search .................................. 355/44, 53, 55, 355/67, 71, 77; 430/5, 30, 22; 250/492.1, 492.2, 492.22, 492.23; 356/122, 124; 359/40, 45, 49

[56] References Cited

U.S. PATENT DOCUMENTS

| | | | |
|---|---|---|---|
| 4,528,448 | 7/1985 | Doggett | 250/231.14 |
| 4,736,360 | 4/1988 | McMahon | 370/3 |
| 5,112,722 | 5/1992 | Tsujino et al. | 430/290 |
| 5,116,110 | 5/1992 | Kahn | 359/40 |
| 5,315,629 | 5/1994 | Jewell et al. | 378/34 |
| 5,339,346 | 8/1994 | White | 378/34 |
| 5,361,292 | 11/1994 | Sweatt | 378/34 |
| 5,439,781 | 8/1995 | MacDowell et al. | 430/311 |
| 5,461,239 | 10/1995 | Atherton | 250/566 |
| 5,479,238 | 12/1995 | Whitney | 355/53 |
| 5,512,759 | 4/1996 | Sweatt | 250/492.1 |
| 5,608,576 | 3/1997 | Han et al. | 359/562 |
| 5,703,675 | 12/1997 | Hirukawa et al. | 355/53 |
| 5,786,116 | 7/1998 | Rolfson | 430/5 |
| 5,801,821 | 9/1998 | Borodovsky | 356/124 |

OTHER PUBLICATIONS

Sweatt, W.C., Chow, W.W., "Investigation of Image Defects in EUV Lithography Experiments" Optical Society of America, Proceedings vol. 23, pp. 126–131, 1995.

*Primary Examiner*—Safet Metjahic
*Assistant Examiner*—Hung Henry Nguyen
*Attorney, Agent, or Firm*—Timothy Evans

[57] ABSTRACT

The present invention relates an apparatus and method for creating a bright, uniform source of partially coherent radiation for illuminating a pattern, in order to replicate an image of said pattern with a high degree of acuity. The present invention introduces a novel scatter plate into the optical path of source light used for illuminating a replicated object. The scatter plate has been designed to interrupt a focused, incoming light beam by introducing between about 8 to 24 diffraction zones blazed onto the surface of the scatter plate which intercept the light and redirect it to a like number of different positions in the condenser entrance pupil each of which is determined by the relative orientation and the spatial frequency of the diffraction grating in each of the several zones. Light falling onto the scatter plate, therefore, generates a plurality of unphased sources of illumination as seen by the back half of the optical system. The system includes a high brightness source, such as a laser, creating light which is taken up by a beam forming optic which focuses the incoming light into a condenser which in turn, focuses light into a field lens creating Köhler illumination image of the source in a camera entrance pupil. The light passing through the field lens illuminates a mask which interrupts the source light as either a positive or negative image of the object to be replicated. Light passing by the mask is focused into the entrance pupil of the lithographic camera creating an image of the mask onto a receptive media.

6 Claims, 7 Drawing Sheets

A.                            SIMPLE KÖHLER

B.                            ANNULAR

C.                            QUADRAPOLE

APPARATUS AND METHOD FOR
GENERATING PARTIALLY COHERENT
ILLUMINATION FOR
PHOTOLITHOGRAPHY

STATEMENT OF GOVERNMENT INTEREST

This invention was made with Government support under contract DE-AC04-94AL85000 awarded by the U.S. Department of Energy to Sandia Corporation. The Government has certain rights in this invention.

BACKGROUND OF THE INVENTION

The present invention relates generally to the field of projection lithography as it is applied to the production of semiconductor integrated circuits components. More particularly, the present invention relates an apparatus and method for creating a bright, uniform source of partially coherent radiation for illuminating a pattern, in order to replicate an image of said pattern with a high degree of acuity.

Lithography refers to a family of techniques for transferring an image rendered on one form of media onto that of another media, typically by photographically "printing" the image. Obvious examples are posters and postage stamps. Similarly, semiconductor microcircuit have been made, for many years, using this technique: silicon substrates upon which these circuits are to be created are coated with a light (radiation) sensitive material chosen for its ability to accurately replicate the desired image, exposed to a source of radiation partially blocked by a mask to render a pattern. Typically, the circuit pattern is rendered as a positive or negative mask image which is then "projected" onto the coated substrate, in either a transmission or reflection mode, depending on the type of optical system being used. The mask is thus imaged on the surface of the coated substrate where the incoming light (radiation) chemically changes those areas of the coating on which the process light (radiation) impinges, usually by polymerizing the coating exposed to the radiation. Depending on the developer (solvent) used the unpolymerized areas are removed, being more soluble in the developer than the polymerized regions, and the desired pattern image remains.

Since this process allows the user to effectively replicate the mask image indefinitely with little additional expense, "projection" lithography has become an essential and powerful tool for manufacturing semiconductor "chips." However, as the drive to place ever greater numbers for components on those chips continues, the need to resolve ever smaller features also continues. In doing so, the diffraction limits of visible light wavelengths have been reached. In order to continue "printing" these features with acuity, using shorter wavelength radiation is necessary. Currently "deep" ultraviolet and "soft" x-radiation (wavelengths from about 300 nm to 60 nm) are now being actively researched. However, the problem of diffraction limited optics remains and the drive to using wavelengths below 300 nm provide only limited advantage: 13 nm radiation, in fact, only provides enough of an advantage to begin printing features of about 0.10 μm.

As feature patterns shrink higher fluence deep ultraviolet (UV) sources become necessary in order to provide sufficient radiant energy per unit area to "print" these features. Because of this, lasers are now used extensively for semiconductor lithography. Illumination by a laser, however, is, by its very nature, illumination by a "bright", point source of highly coherent light and the smaller (relative) features illuminated by these sources are subject to resonance "ringing. Furthermore, in incoherently illuminated optical systems, smaller (relative) features are attenuated due to a fall-off in the modulation transfer function ("MTF").

It is known that by introducing partial coherence into the illumination affects the image quality of printed features, that is, partial coherence can counter the above mentioned attenuation, and properly adjusted, does not add too much "ringing". Providing a source of partially coherent illumination is normally accomplished by underfilling the optical system entrance pupil with Köhler illumination. In other words, the source is imaged into the entrance pupil and this image is smaller than the pupil by a factor of about σ=0.6. This value of σ is a reasonable compromise in order to achieve the desired balance between attenuation of small features and "ringing" in all features. Factors in the range of $0.4 \leq \sigma \leq 0.8$ could be used as well.

Chip manufacturers have also begun using "engineered illumination" to help print smaller and smaller features. This technique relies upon the use of various "patterns" of illumination including the "under-filled" Köhler disk, annular and quadrapole illumination, and off-axis illumination. Unfortunately, in order to use one or several of these methods, results in reduced condenser efficiency or requires that the illuminator be seriously modified. For example, when a somewhat higher coherence is needed, an aperture is partially closed which reduces efficiency. If either quadrapole or annular illumination is used, a special mask must be made and inserted in the camera pupil plane. This, in turn, blocks light and thereby reduces efficiency.

Off-axis illumination requires that the condenser be disassembled and reconfigured. All of these methods are time consuming, expensive, and less efficient then current technology albeit capable of achieving smaller design patterns.

Finally, the ability to provide a source of illumination which is not only bright but optimized for the features sizes exhibited by the part pattern to be replicated is critical.

A method for quickly changing and "matching," the illumination pattern used in lithographic systems, would be highly desirable.

DESCRIPTION OF THE PRIOR ART

The use of gratings is familiar to both the fields of holography and of lithography. While gratings are employed to help scatter light in a random manner little is found to suggest reconstituting light incident on such a grating to form a plurality of separate beams and for using those beams to form an "engineered" source of light, optimized for the type of print features to be rendered. The use of a diffraction grating, even a fairly complex grating, is not new. Most applications, however, refer only to a grating with a single, repeated blaze pattern, although, some have fairly complex geometries. An example of this is U.S. Pat. No. 4,736,360 which teaches a spherically curved echelon which is simultaneously blazed at two or more different wavelengths. U.S. Pat. No. 5,461,239 teaches a memory diffraction grating having a plurality of spaced ridges each having a plurality of optically reflective facets which, when illuminated by an incident light beam, will produce a number of diffracted beams corresponding to the number of facets used. This device is therefore utilized as a machine readable memory element whose information is contained in and configured as a diffraction grating. The '239 patent also discloses a diffraction grating comprising a "checkerboard" patterned arrangement of grating. U.S. Pat. Nos. 5,339,346 and 5,439,781 both teach the use of a scatter plate for introducing divergence in a light beam. The '781 patent further teaches its use for shaping the incident beam along the arcuate center line of a ringfield slit. '781 also discloses two alternate geometries of scatter plates: one consisting of mirrors having an undulating surfaces, another consisting of an array of pyramidal shapes. Each of the disclosed scatter plate designs are used to increase the divergence of an incoming beam of light. None are used to perform the function of simultaneously parsing an incident beam into a multiplicity of beams and then redirecting each of those multiple beams into a specific location in a camera aperture.

SUMMARY OF THE INVENTION

The principle object of the present invention is to provide means for creating an extended source of illumination, using coherent light, to generate a series of unphased radiators for illuminating a lithographic mask.

It is another object of this invention to provide a method for off-axis illumination which avoids disassembly of projection optical elements.

It is another object of this invention to provide a scatter plate method for changing the apparent source illumination geometry presented to a projection lithographic camera.

It is still another object of this invention to provide a scatter plate having a plurality of differentiated diffraction zones.

Yet another object of this invention is to provide a scatter plate with diffraction zones blazed onto its surface.

It is still another object of the invention is to provide diffraction of all or nearly all of the light into the +1 diffracted order.

It is also an object of the invention to ensure that the entrance pupil of the projection camera is illuminated in such a manner as to underfill this aperture by about 30% to 60%.

It is another object of this invention to provide quadrapole illumination within the entrance pupil of the projection camera.

Yet another object of the invention is to provide annular illumination within the entrance pupil of the projection camera.

Another object of this invention will be to provide all of the foregoing by either transmitted or by reflected light.

Additional objects, advantages, and novel features will become apparent to those of ordinary skill in the art upon examination of the following detailed description of the invention or may be learned by practice of the invention. The objects and advantages of the present invention may be realized and attained by means of the instrumentality's and combinations particularly pointed out in the appended claims.

Accordingly, the present invention accomplishes the foregoing objects by introducing a novel scatter plate into the optical path of source light used for illuminating a replicated object. The scatter plate has been designed to interrupt a focused, incoming light beam by introducing about at least 4 rectangular diffraction zones blazed onto the surface of the scatter plate which intercept the light and redirect it to 4 positions in the condenser entrance pupil each of which is determined by the relative orientation and the spatial frequency of the diffraction grating in each of the several zones. Light falling onto the scatter plate, therefore, generates a plurality of (apparent) unphased sources of illumination as seen by the back half of the optical system; "apparent" because the plurality of beams emanating from the several zones on the scatter plate illuminate any localized area of the mask at different times and, therefore, from the perspective of the mask, the beams are unphased. If each one of these sources can be directed to a specific relative location in the entrance pupil of a system in such a way as to underfill that aperture by about 40% the desired partially coherent illumination is achieved or well simulated.

In addition, in order to achieve the foregoing objectives it is absolutely critical that the mask and scatter plate move relative to one another in order that the palate's image move relative to the mask. This is achieved by moving either the scatter plate or the mask or both together. If the lithographic tool is a scanning system, then the mask is moved and the scatter plate can be stationary. Alternatively, if a full-field imager is used then the scatter plate will be moved while the mask is stationary.

A simplified schematic of an image projection system is shown in FIG. 1. The system comprises essentially a high brightness source, such as a laser, creating light which is taken up by a beam forming optic which focuses the incoming light into a condenser which in turn, focuses light into a field lens creating Köhler illumination image of the source in a camera entrance pupil. The light passing through the field lens illuminates a mask which interrupts the source light as either a positive or negative image of the object to be replicated. Light passing by the mask is focused into the entrance pupil of the lithographic camera creating an image of the mask onto a receptive media. The reader will recognize that the arrangement herein described will work equally well if the scatter plate is designed for transmission or for reflection.

The scatter plate disclosed and described herein comprises a plurality of linear diffraction gratings each capable of redirecting the incident light from the undiffracted focus (i.e., the focus when the scatter plate is not present) to a new point in the condenser entrance pupil. The scatter plate gratings are each typically created by lithographic means as a plurality of grating "zones." Other methods for creating the are possible, including e-beam writing, holography, and the like. It is not the purpose of this disclosure to recite all possible alternative methods for creating the architecture of the scatter plate since the choice of method is a matter of convenience only and not should not be construed as in any way further limiting the instant invention.

Each of these so-called "zones" resembles a long, narrow rectilinear "slit" lying parallel to a common axis of the plate. Each "slit", in turn, has a multiplicity of blazed fringes across the length of the slit. Each set of fringes in each zone, furthermore, has a single periodicity, which may of may not be the same as any other zone, and each is oriented at a specific angle measured from one axis of the plate. This angle and the periodicity are chosen so as to direct light to a predetermined position in the entrance pupil of the optics condenser. In order to ensure that nearly all of the incoming light falling on any particular slit is diffracted into the +1 order, each fringe is typically configured as a wedge, or at least an approximation to a wedge, made up of at least 3 rectangular "steps" above a "landing"; each step successively higher then the preceding step by the same incremental amount.

Finally, the applicant, in his earlier published work, has discovered that Köhler illumination can be modeled with about a dozen point sources of light evenly distributed as shown in FIG. 4a. The disclosed scatter plate is, therefore, illustrated herein as having 12 distinct grating zones. However, in order to avoid unduly complicating the invention a compromise between about 8 and 48 zones is recommended. Other arrangement, however, are possible and are, therefore, contemplated by this instant invention. The disclosure of any specific number of zones should not be construed as in anyway limiting the scope of this invention.

Further scope of applicability of the present invention will become apparent from the detailed description of the invention provided hereinafter. It should be understood, however, that the detailed description of the invention and the specific examples presented, while indicating preferred embodiments of the present invention, are provide for illustrative purposes only because various changes and modifications within the spirit and scope of the present invention will become apparent to those of ordinary skill in the art from the detailed description of the invention that follows.

BRIEF DESCRIPTION OF THE DRAWINGS

The accompanying figures, which are incorporated into and form part of the specification, further illustrate the present invention and, together with the detailed description of the invention, serve to explain the principles of the present invention.

DETAILED DESCRIPTION OF THE PREFERRED EMBODIMENT

Figure 1:
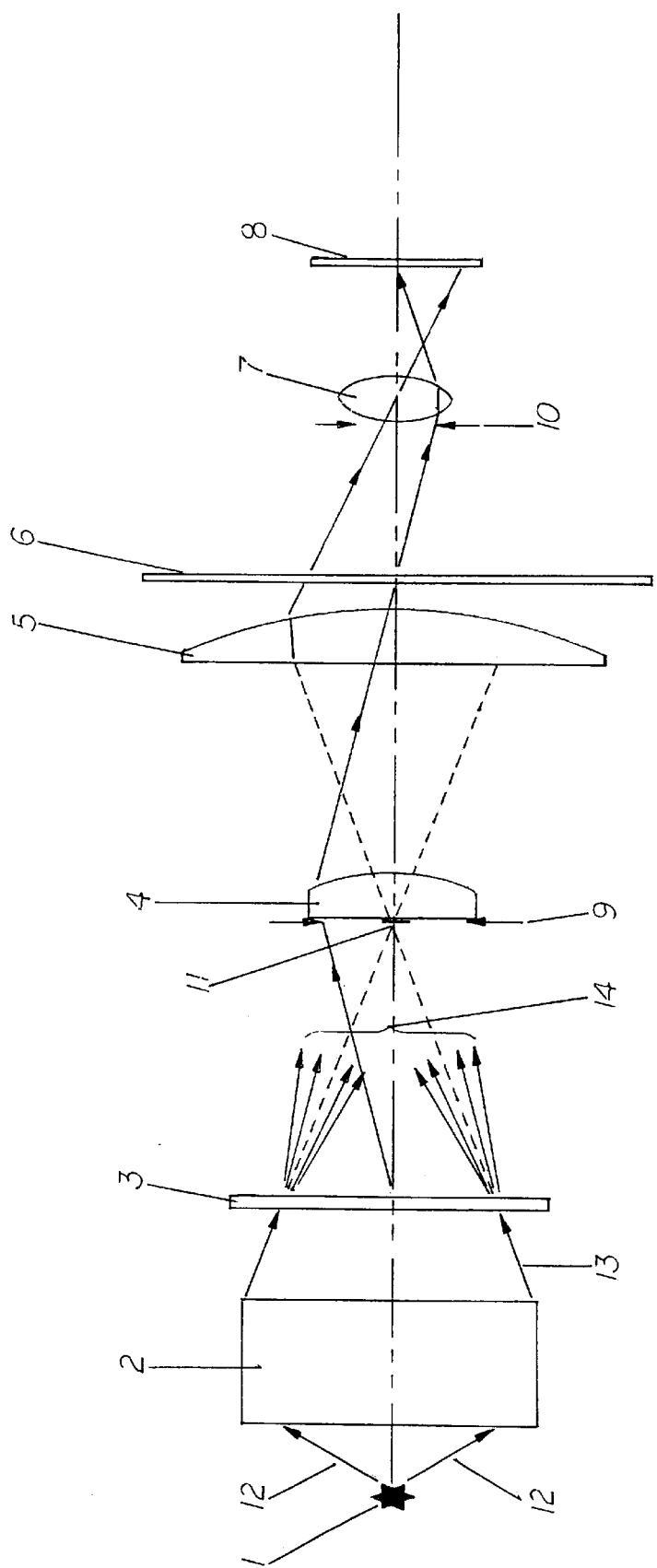
FIG. 1 is a rudimentary schematic diagram of the general optical arrangement of the photolithography system for transmitted light.

The following terms of art are defined before providing a description and discussion of the present invention.

Coherent light means a "point" source of light characterized by light waves having a constant phase relationship with all other light waves generated by the source.

Condenser means a large aperture short focal length lens or system between the source and mask used for collecting light emanating from the scatter plate to illuminate the mask.

Camera means an optical system for projecting an image, typically a reduced image, of the mask on a suitable substrate.

Diffracted Order means an integer number of wavelengths difference in the optical path length between adjacent beams of light departing from adjacent fringes in a diffraction grating. Said beams constructively interfere with each other. These constructive interference points are manifest as centers of light maxima typically seen in diffraction patterns.

Extended source means an apparent collection of unphased radiators; effectively the filament of an incandescent lamp.

Fringe means one of a series of periodic features formed onto the surface of a plate for diffracting light, the feature periodicity having a functional relationship to the light wavelength intended for diffraction and the angle through which the light is diffracted.

Incoherent light means light characterized by waves having a generally random distribution of phases; light emanating from an extended source Köhler Illumination means a method of illumination wherein a primary condenser lens is used to collect light rays generated by a primary source of illumination and focus an image of that source into the entrance pupil of a second condenser or projection lens which in turn focuses an image of the primary condenser near the plane of the object to be illuminated, i.e., the mask. The image of the primary condenser therefore becomes the source of illumination resulting in an apparently uniform field of light across the illuminated object.

Lens means an optical element which causes light rays to converge or to diverge.

Light means any wavelength of electromagnetic radiation useful in photolithography, including visible, ultraviolet, and x-ray.

N.A. means the numerical aperture of a lens and is a relative measure of the resolving power of that lens. N.A. is measured by the quantity nsinµ where n is the refractive index of the transmitting media and the angle 2µ is the angle subtended by the lens as measured from the source/object and the entrance pupil of the lens Partial coherence means a source of light which is characterized as a set of discrete incoherent radiators that do not fill the whole entrance pupil.

Period means a regular, repeated interval in time or in space. As applied to diffraction fringes Period means the distance between identical features in or on adjacent fringes Pupil means a real or virtual aperture away from the object and image planes that defines the area through which light must enter the lens/camera Ringing means a diffraction effect at an edge or small feature reminiscent of a resonance characterized as a marked increase, above background, or decreased below background in illumination intensity.

Scanning Camera means an instrument used in lithographic replication designed to transfer source information from a replicating "mask" onto a 'target" wafer. The information which is to be transferred to the wafer is the image of the mask and can be described as being contained in an array having a multitude of rows and columns, i.e., a pixel array. The scanning camera typically exhibits a long narrow imaging field which completely spans the width of the array but only incorporates a few of its rows. The camera operates by "scanning" across the mask at a constant velocity in a direction perpendicular to the array's rows by moving the mask and wafer across the camera's imaging field in unison so that the image of the mask remains fixed on the wafer during the period over which it is illuminated. Each point on the mask is therefore transferred, or "imaged, onto the wafer with the same degree of exposure as any other point.

Unphased radiators means a group or set of light sources generating light having no phase relationship between sources within the group or set.

Embodiment 1

The instant invention is drawn to a device for creating a type of illumination for illuminating a pattern mask used in projection photolithography in both the transmissive and reflective modes. This invention is also drawn to a method for utilizing such a device in the manufacture and production of lithographically generated semiconductor components using ultraviolet light at wavelengths between about 250 nm and 100 nm, in general and at 248 nm, 193 nm, or 157 nm, in particular. An embodiment incorporating a reflective scatter plate could operate at much shorter wavelengths between about 250 nm and 10 nm.

Transmission

Figure 4:
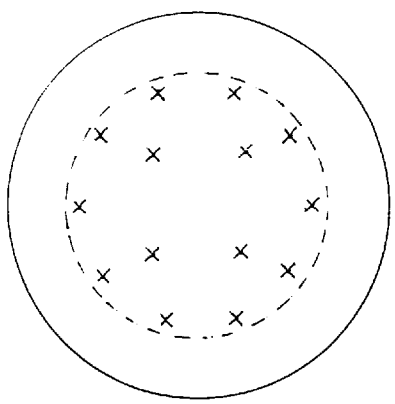
FIG. 4 presents a schematic diagram of the 3 types, or configurations, of "engineered" illumination. Each configuration is optimized for a different set of pattern features which are to be reproduced. Each configuration of illumination is produced by scatter plates having fringes oriented to direct beams portions into the desired location indicated by the "X's" in each illustration. Each "X" represents the collected and focused image of one of the scatter plate "zones" in the entrance pupil.
Figure 4:
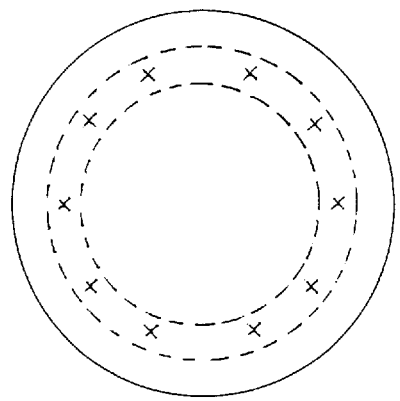
Figure 4:
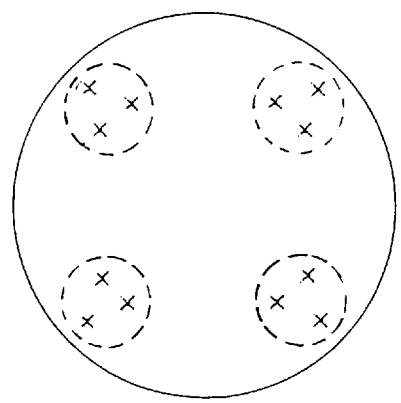

A generalized, and very simple schema for projection system photolithography is presented in FIG. 1. It consists of a bright source of approximate coherent light 1, a laser or the like, producing rays 12, some of which fall onto a beam forming optic 2. Light from source 1 is collected and reformed into the image of a long and very narrow rectangular or arcuate "slit" (not shown) and focused into the center of the entrance pupil 9 of condenser lens 4. The purpose of condenser lens 4 is to collect and image the slit onto the mask 6. Field lens 5 images condenser entrance pupil 9 onto the entrance pupil 10 of a camera 7. Before doing so, however, this focused light first falls onto a rendering of the desired print image on mask 6. The beam of light carrying the imaging information of this mask 6 is directed into pupil 10 and the image projected onto a light-sensitive medium (not shown) on wafer 8, placed in the image plane of camera 7 thus creating an image of mask 6 on wafer 8. The novel feature of the instant invention comprises the use of a so-called "scatter plate" 3 which is inserted into the optical path of the above described system at a point either behind (shown in FIG. 1.) or ahead of (not shown) the beam forming optic 2. It is intended that scatter plate 3 intercept light rays 13, reconstituting these rays as a plurality of discrete, focused beams 14, laterally shifting each beam, by diffraction, into a plurality of different locations within condenser pupil 9 so as to uniformly populate about 60% of that aperture and thereby creating the effect of a source comprising a uniform disk of incoherent radiators which produces partially coherent illumination. FIG. 4 illustrates three preferred distributed patterns of light: simple Köhler, comprising a more or less uniform distribution of light across a disk covering the center ⅔ of the condenser aperture, annular, comprising a wide ring of uniform light centered in the aperture, and quadrapole, which comprises four equal sized off-center disks of light distributed every 90° about the aperture center. Each of these patterns is optimized for a different type of feature to be reproduced. Any or all of these patterns could be used in the preferred embodiments.

Those skilled in the art will recognize this arrangement may be used with either a reflective or transmissive mask 6 and with transmissive or reflective scatter plate 3 and that a small rejection means comprising a reflective or absorptive spot (in the case of transmission mode) or a hole or non-reflective patch (in the case of reflective mode), must be placed at the center point of condenser lens 4 to eliminate any undiffracted light from passing through to camera 7.

Figure 2:
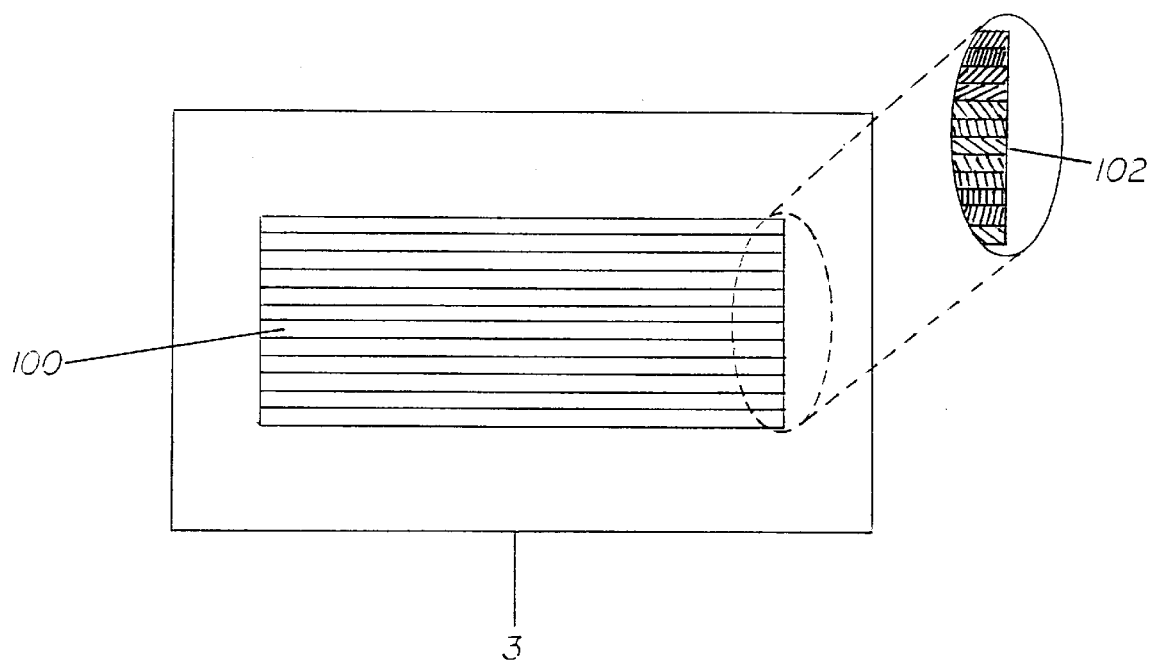
FIG. 2 illustrates a diagram of the scatter plate showing a general arrangement of zonal fringe patterns. A 12 zone plate is shown. Plates with few or more zones are possible and usually desired. For example, see FIG. 4a, whose pattern would require light positions at 14 zones.

FIG. 2 illustrates a front view of scatter plate 3 illustrating the multi-zone collection of diffraction gratings each contiguous one to the next. Each individual zone 100 is filled with a set of repeating fringes comprising fringe pattern 102 forming an individual grating. The orientation (rotation) angle α 101 of the grating and the period 106 of the fringes are each chosen so as to direct light falling on that grating to a specific non-repeated location within condenser pupil 9, slightly off-center and distributed as shown in FIG. 4a–c. The collection of images created by the gratings taken as a whole is intended to fill various areas within the condenser pupil aperture 9. Typical examples are presented in FIGS. 4a to 4c.

The use of a "blazed" grating is familiar to those skilled in the art. A standard ruled grating diffracts the light falling onto it into several orders. The technique of blazing involves the creating of a grating with a slit transmission function that will shift the diffracted light so that its maximum will coincide with one of the nonzero orders, typically the +1 or −1 orders. This is done by replacing the slits of a ruled grating with an array of nearly identical transparent wedges on the surface of a diffraction plate, then light passing through each wedge will be slightly deviated in angle, as will be seen later.

Fabricating these wedges, however, can be difficult. A reasonable approximation can be constructed by overlaying a series of rectilinear "steps" to create a staircase arrangement and then repeating this process again and again so as to generate a periodic set of fringes in each zone 100. Fabrication is performed by a lithographic mask-and-etch techniques or by using an electron beam "writer" to "write" and etch the desired step pattern. The instant invention discloses fringes having eight steps per fringe. However, numbers of steps as low as three per fringe will suffice although more light is lost into orders other than the desired one. The eight steps may be fabricated using well known techniques in three mask-and-etch or three write-and-etch steps.

Figure 3:
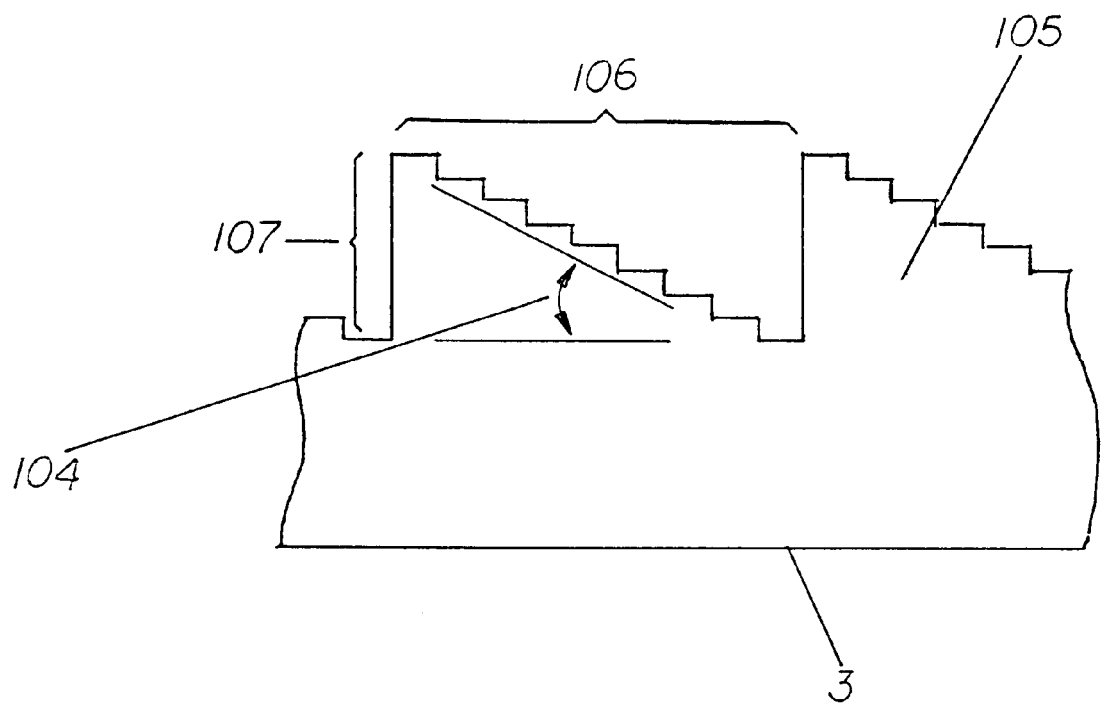
FIG. 3 is a cross-sectional side view of an individual fringe profile showing the arrangement of "steps" forming a blazed grating on the plate. An eight "step" blaze is illustrated. Other arrangements are possible. A minimum of three "steps" is necessary to achieve reasonable diffraction efficiency.

The steps themselves are fabricated so as to be of uniform height above each preceding step and each fringe "wedge" 105 within zone 100 consists of the same number of steps. FIG. 3 shows an exaggerated view if a fringe cross-section. As will be seen, the aspect ratio of step height-to-step width is about 1:20 to about 1:30, meaning the wedge shape is approximated fairly closely.

To illustrate the physical design of "wedge" 105, we shall assume that incoming light, manifested as a plurality of parallel rays, is incident on scatter plate 3 at an angle θ, is diffracted thereafter and propagated out from plate 3 at an angle θ', and that all of these angles (as measured to the wedge normal) remain small. It can then be shown that:

$$\sin\theta - \sin\theta' = m\lambda/a$$

where λ is the wavelength of light passing through the grating, m is the order for which the grating is optimized and a is (approximately) the blaze. It follows that if the pattern of diffracted light is maximized to populate the +1 order we have:

$$a = \lambda/(\sin\theta' - \sin\theta)$$

or $$a = \lambda/\sin\Delta\theta$$

Figure 6:
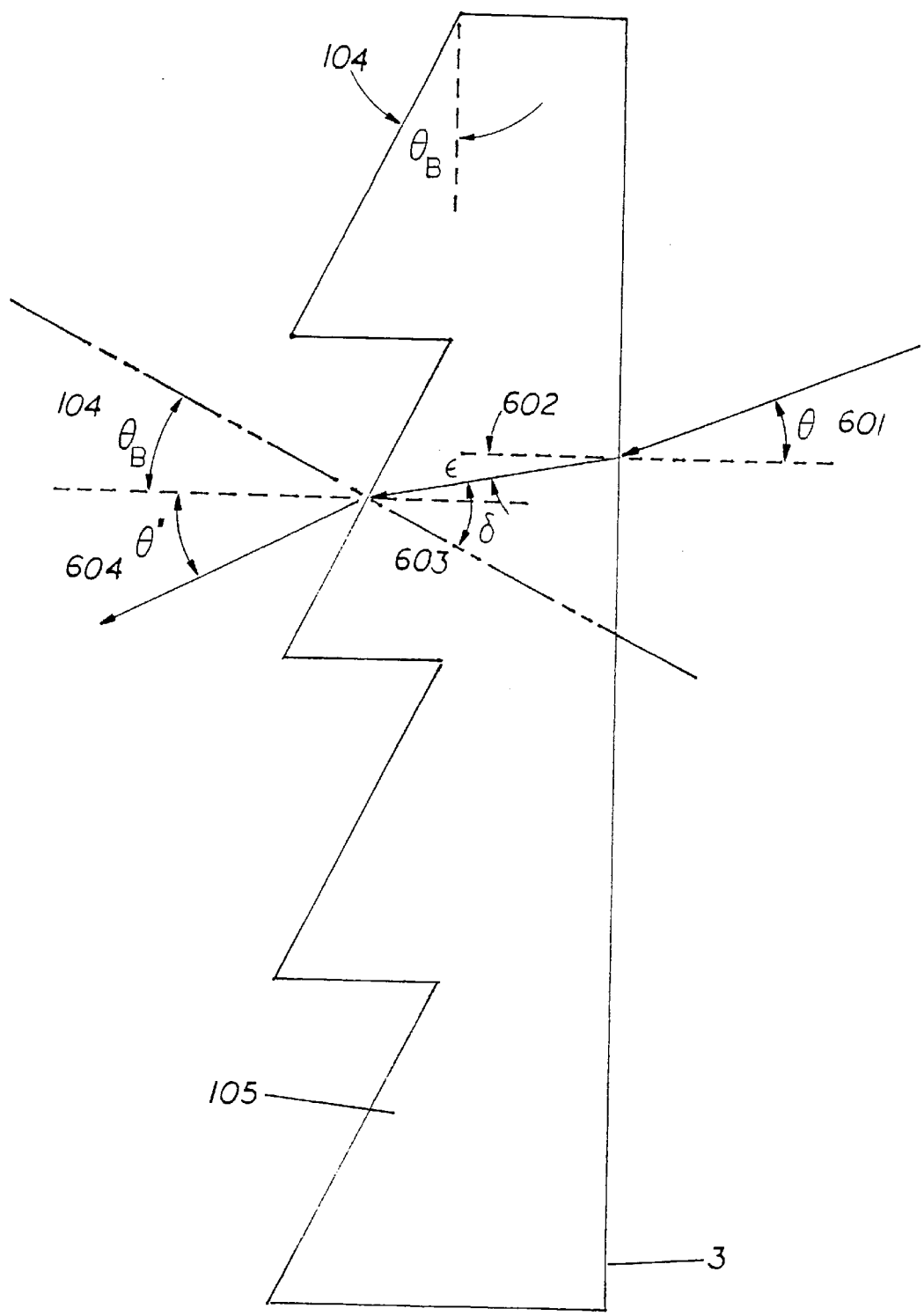
FIG. 6 shows the general arrangement of fringes and several key parameters of "blazed" diffraction gratings.

In order to accomplish this, to optimize the light flux being directed into the +1 order, a blaze angle $\theta_B$, as shown in FIG. 6, is chosen so that the macroscopic refraction equation directs incoming light into the desired exit angle, $\theta'$. As a first approximation, therefore, $$n \sin(\epsilon+\theta_B)=\sin(\theta_B+\theta'),$$

which is just $$\sin\theta'\cos\theta_B+\sin\theta_B\cos\theta'=n\sin\theta_B\cos\epsilon+n\sin\epsilon\cos\theta_B.$$

For small angles, the cosine function approaches 1 and, as seen in the geometric construction illustrated in FIG. 6, n sin $\epsilon$ is equal to sin $\theta$. The foregoing relationship, therefore, reduces to, $$n\sin\theta_B-\sin\theta_B \cong \sin\theta'-\sin\theta$$

Finally, the linearized form of the refraction equation, therefore, is just equal to, $$\theta_B \cong (\theta'-\theta)/(n-1)$$

or, just $$\theta_B = \Delta\theta/(n-1).$$

since, for small angles, the sine function of an angle closely approximates that angle.

In brief, a blazed grating is designed as follows: the position in space which the designer wishes to illuminate with the diffracted beam is first specified by specifying the elevation (or declination) and the azimuth of the beam vector. This, in turn, is controlled by the orientation angle $\alpha$ 101 of the fringe pattern and the angle through which the beam is diffracted. The shape of the blazed structure is then specified and consists of a determination of the width of the spacing between fringes, and the blaze angle necessary to populate the +1 order along the desired beam vector. (The number of "steps" on the fringe will determine how efficiently the desired order is populated.)

Lastly, it is generally desired to illuminate the entrance pupil of the camera out to about 70% of its diameter. This means that the incident light must be diffracted out to about 70% of the pupil radius. Thus, the angle of diffraction, that is the angular change, $\Delta\theta$, in the direction of the incoming light beam which is necessary to accomplish this is:

$$\Delta\theta=0.7(N.A./m),$$

where $\lambda$ is the wavelength of the incoming light, m is here the magnification of the camera, and N.A. is the camera numerical aperture.

From the diffraction equation, the fringe spacing necessary to diffract light through an angle of $\Delta\theta$ is just:

$$a=\lambda/\Delta\theta \approx \lambda m/0.7 N.A.$$

Furthermore, substituting the earlier expression relating $\theta_B$ to $\Delta\theta$ into the above relationship allows for the determination of the blaze angle 104 which is the last variable as yet unspecified, $$\theta_B(n-1)=\lambda/a$$

That is angle $\theta_B$ 104 of the blazed wedge 107 is equal to the wavelength of the incident light divided by the quantity a(n−1) where n is the index of refraction of the medium through which the light is passing. Depending upon what value our refractive index n takes that multiple will vary anywhere between about 3 and about 1.1

By way of example, a typical state-of-the-art projection equipment utilizing a wavelength of 248 nm, and having a magnification of 4, and numerical aperture of 0.5 would result in a fringe spacing of about 2800 nm or 2.8 $\mu$m. This in turn results in a blaze angle, $\theta_B$ 104 of about 10° when n is about 1.5. This result requires a condenser aperture having a radius of slightly greater than 12.5 mm if we assume a 100 mm spacing between condenser lens 4 and scatter plate 3 given the shift in the diffracted image of $\theta_B$. In general, a simple geometric construction, as shown in FIG. 5b, illustrates that the displacement D of any particular foci of rays 14 emanating from zones 100 away from the center of condenser lens 4, for any condenser-to-scatter plate spacing X is approximately equal to, $$D \cong X\lambda/a$$

Therefore, by varying the period, a, of the grating it is possible to control the position of these foci along a radius perpendicular to a direct normal to the fringe pattern 102, in effect moving the foci in or out from the center of the condenser lens 4.

The final variable necessary to complete the "construction" of the multiple beam source is the relative angular orientation $\alpha$ 101 of fringe pattern 102 within each zone 100 of scatter plate 3. By manipulating angle 101 and fringe width 103 we are able to control the relative position of each of focused beams 14 associated with each zone 100. The former setting the relative displacement from the center of pupil 9, the later setting the positional rotation about that center: the locus of points swept out by rays emanating from k number of zones 100 having all possible orientations 101 and assuming all zones having the same fixed fringe spacing, is just a circle whose radius is the displacement D shown above.

Figure 5:
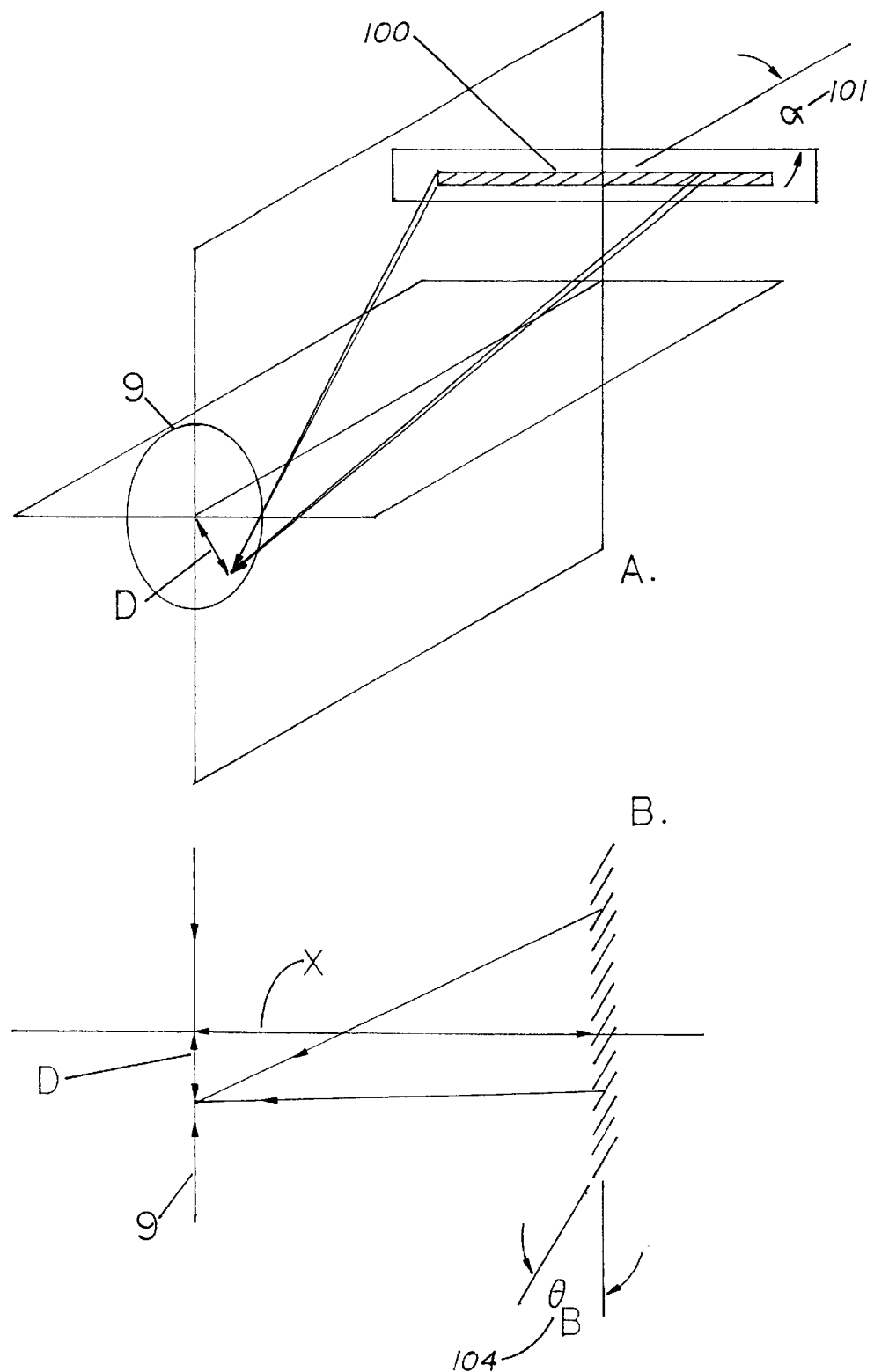
FIG. 5a is a prospective view of the light from one zone falling into the upper right-hand quadrant (as viewed from the camera) of the condenser entrance pupil. Also shown is fringe orientation (rotation) α.
FIG. 5b is a top view of 5a illustrating the blaze angle $\theta_B$ and displacement D.

FIG. 5a illustrates a single zone (or zone portion, as determined by the illumination emanating from optics 2) directs light into a particular location depending upon the choice of orientation $\alpha$ and blaze angle $\theta_B$ 104.

By varying these two independent parameters, the fringe spacing a and therefore the blaze angle $\theta_B$ 104, and the fringe orientation or rotation $\alpha$ 101, light 14 may be placed in whatever location desired within the condenser aperture. This summation of source images is then projected into field lens 5 by condenser lens 4 and brought to focus in the plane of mask 6. The "printing" process is completed by moving the mask relative to scatter plate 3 such that the apparent motion is perpendicular to the longitudinal axis of grating zones 100. After scanning across the approximately 12 grating zones 100 the mask 6 will have been uniformly illuminated by what appears as a series of unphased radiators located at preselected points in the camera entrance pupil.

Embodiment 2

This invention is also drawn to a method for utilizing such a device in the manufacture and production of lithographically generated semiconductor components using extremely short wavelength ultraviolet light and soft x-radiation at <20 nm in a second embodiment. In particular:

Reflection

Figure 7:
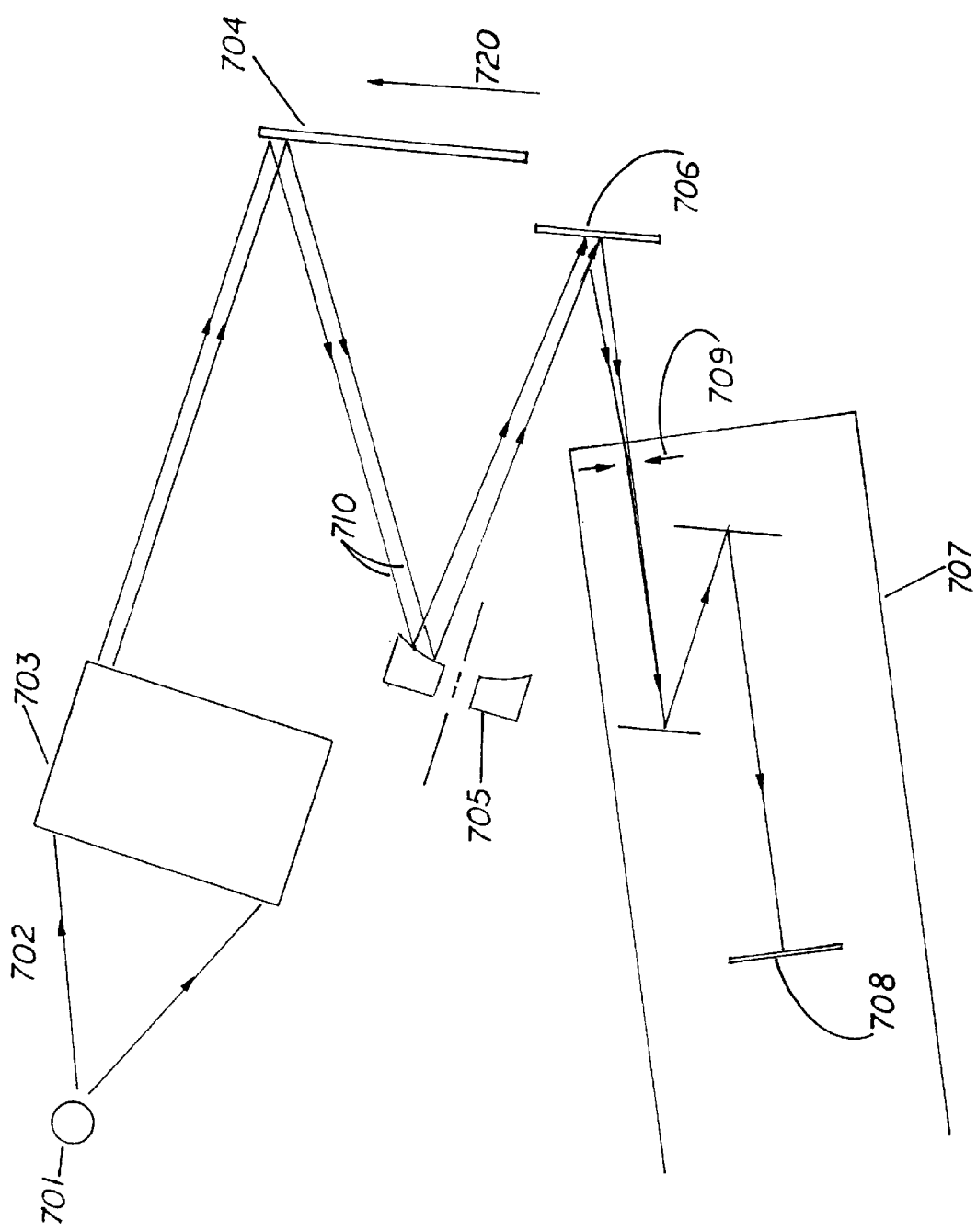
FIG. 7 shows is a simplified schematic diagram of the general optical arrangement of the photolithography system for reflected light.

The constant drive to reduce semiconductor device feature size has necessitated a corresponding drive to perfect the utility of shorter and shorter wavelengths of light in these lithographic applications. Current industry research efforts are focusing on light sources which generate wavelengths below 20 nm. Light in this regime can be characterized as either extreme ultraviolet or soft x-ray. As wavelengths approach the realm of x-radiation the optical elements used to manipulate this light must change and become increasingly sophisticated since elements used for visible light are effectively opaque to x-rays. Lens elements must be replaced by reflecting means to gather and focus the light beam. By way example a second schema, in this case configured for reflecting photolithography, is shown in FIG. 7. The method is based on the general arrangement taught in U.S. Pat. Nos. 5,361,292 and 5,512,759 commonly owned by applicant and herein incorporated by reference. As seen in FIG. 7, the general arrangement of optical features for reflection is nearly identical to that of transmission. It consists of a bright source of approximate coherent light 701, again a laser, or the like, which produces rays 702. Some of these rays 702 fall onto a beam forming optic 703 which collects and reforms light from source 701 into the image of a long and very narrow rectangular or arcuate "slit" (not shown). The beam forming optic 703 reconfigures the source rays into a "slit" of uniform illumination and directs the light onto the scatter plate 704 such that the slit falls on the plate parallel to the plate zones (not shown). It is intended that scatter plate 704 intercept this light, reconstituting it as a plurality of discrete, focused beams 710 directed into condenser subsystem 705. The purpose of the condenser 705 is to collect and image the "slit" and redirect it onto reflective mask 706, the mask having a rendering of the desired print image, and to image the focal spot, i.e., the focus of the source images, into the camera entrance pupil 709. Light from the mask then enters camera 707 where the imaging information carried in the beam reflected by the mask is projected onto a light-sensitive medium (not shown) on wafer 708. In the case of reflection the scatter plate 704 acts as a "mirror" diffracting light. As before, the diffraction equation is the same, $$a=\lambda/(\sin\theta'-\sin\theta),$$

again where, $\theta$ is the angle of incidence and $\theta'$ angle of diffraction. Furthermore, the condenser 705 takes the form of an aspheric mirror for collecting and redirecting the diffracted rays onto mask 706. As before, the mask 706 may be either a contact, or more preferably the reflecting type mask which is shown in FIG. 7. Printing is accomplished by moving the scatter plate perpendicularly across the "slit" in such a way as to translate each of the plate zones (not shown in FIG. 7), illuminating the length of each in turn, as it moves across the "slit."

The reader will recognize and appreciate that there are many other possible variations of the above described embodiments which may be made without departing from the scope of this invention. The foregoing description is intended as illustrative of this invention and is not intended to in anyway limit its application or scope beyond that which is a reasonable interpretation of this description.

What is claimed is:

1. A method for providing a source of partially coherent illumination, comprising the steps of:

a) providing a source of nominally coherent light, said light source comprising a beam, said beam having a light path, said beam further comprising a plurality of light rays;

b) directing said beam into a beam forming means, said means for configuring said beam to create a source image;

c) focusing said source image into a condenser means, said means having an entrance pupil aperture;

d) providing a means for preventing rays from passing through a central region of said entrance pupil;

e) interposing a diffraction means into a plane substantially perpendicular to said light path between said beam forming means and said condenser means aperture, said means comprising a plurality of diffraction zones; and f) moving said diffraction means at a constant relative speed to said source image such that each said zone is illuminated by said source image for a same period of time and such that each said zone diffracts said source image into a different location within said condenser aperture thereby creating a pattern, said pattern only partially filling said condenser aperture, said pattern selected from a group consisting of simple Köhler, annular, and quadrapole illumination.

2. The method of claim 1 wherein said condenser means is a condenser lens having a front face and said preventing means is a thin reflective or absorptive coating attached to said front face, said coating subtending an area between about 1% to 10% of the center of said condenser lens front surface.

3. The method of claim 1 wherein said diffraction means is the scatter plate for diffracting light, comprising:

a thin plate, said thin plate having a first axis and a second axis defining a surface, said thin plate further having a plurality of contiguous zones laying substantially on said surface, wherein each said zone comprises a blazed diffraction grating having a plurality of fringes arranged along the same one of said plate axes, each said diffraction grating for diffracting said light into the +1 diffracted order.

4. The method of claim 1 wherein said scatter plate comprises at least 4 of said zones.

5. The method of claim 1 wherein the scatter plate comprises preferably about 8 to 24 zones.

6. A method for photolithography using the method of claim 1 further comprising the steps of:

a) focusing said diffracted source image with said condenser means into a camera means entrance pupil aperture, said step of focusing thereby creating an image of said source image in said camera means entrance pupil aperture, said camera means for collecting and focusing light onto a light sensitive media;

b) interposing a mask between said condenser means and said camera means thereby redirecting some of said source image light to create an image of said mask; and c) collecting said mask image light entering said camera means entrance pupil aperture onto said light sensitive media;

d) exposing said media to said mask image thereby replicating said image in said media.

* * * * *